(12) United States Patent
Gao (10) Patent No.: US 11,659,688 B2
(45) Date of Patent: May 23, 2023

(54) DATA CENTER WITH IMMERSION ELECTRONIC RACKS AND TWO PHASE COOLANT UNITS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 24 days.

(21) Appl. No.: 17/354,177

(22) Filed: Jun. 22, 2021

(65) Prior Publication Data

US 2022/0408599 A1    Dec. 22, 2022

(51) Int. Cl.
    *H05K 7/20*           (2006.01)

(52) U.S. Cl.
    CPC ..... *H05K 7/20327* (2013.01); *H05K 7/20318* (2013.01); *H05K 7/20818* (2013.01)

(58) Field of Classification Search
    CPC .......... H05K 7/20809; H05K 7/20818; H05K 7/20781; H05K 7/203; H05K 7/20772; H05K 7/20272; H05K 7/20318; H05K 7/20836; H05K 7/20236; H05K 7/20309; H05K 7/2029; G06F 1/20; G06F 2200/201; G06F 1/206; F28D 15/0266; G11B 33/1413
    USPC ................... 361/699, 700, 679.53, 710, 715; 165/104.33, 104.21, 80.2, 80.4; 174/15.1; 257/714; 62/259.2
See application file for complete search history.

(56) References Cited

U.S. PATENT DOCUMENTS

| | | | |
|---|---|---|---|
| 5,435,381 A * | 7/1995 | Downing | F28B 1/00 165/110 |
| 9,696,235 B2 * | 7/2017 | Alshinnawi | F24F 11/0001 |
| 10,342,164 B2 * | 7/2019 | So | H05K 7/20772 |
| 10,813,253 B2 * | 10/2020 | Lunsman et al. | H05K 7/20781 165/104.33 |
| 10,925,188 B1 * | 2/2021 | Keehn | H05K 7/20718 |
| 2013/0021746 A1 * | 1/2013 | Campbell | H05K 7/20827 165/104.13 |
| 2013/0081791 A1 * | 4/2013 | Tufty | H05K 7/20772 165/104.33 |
| 2014/0218859 A1 * | 8/2014 | Shelnutt | G06F 1/20 361/679.46 |
| 2015/0062806 A1 * | 3/2015 | Shlenutt | H05K 7/203 361/679.53 |
| 2016/0234970 A1 * | 8/2016 | Shelnutt | H05K 7/203 |

(Continued)

*Primary Examiner* — Mandeep S Buttar
(74) *Attorney, Agent, or Firm* — Womble Bond Dickinson (US) LLP (57) ABSTRACT

An information technology (IT) equipment cooling system includes a coolant unit to be coupled to an electronic rack, the coolant unit to supply a two phase liquid coolant to one or more IT equipment cooling sets mounted within on an electronic rack. Each of the one or more IT equipment cooling sets includes an IT unit having one or more pieces of IT equipment configured to provide IT services and is at least partially submerged within the two phase liquid coolant, where, while the IT equipment provides the IT services, the IT equipment generates heat that is transferred to the two phase liquid coolant thereby causing at least some of the two phase liquid coolant to turn into vapor phase. The IT equipment cooling set includes an IT condensing unit having a condenser positioned above the IT unit and the condenser is to condense the vapor back into liquid state.

20 Claims, 6 Drawing Sheets

(56) References Cited

U.S. PATENT DOCUMENTS

2019/0182990 A1* 6/2019 Chen .................. H05K 7/20736
2020/0288600 A1* 9/2020 Gao ................... H05K 7/20263

* cited by examiner

DATA CENTER WITH IMMERSION ELECTRONIC RACKS AND TWO PHASE COOLANT UNITS

FIELD OF THE INVENTION

Embodiments of the present invention relate generally to data center and server cooling. More particularly, embodiments of the invention relate to a data center with immersion electronic racks and two-phase coolant units.

BACKGROUND

Thermal management for a data center that includes several active electronic racks is critical to ensure proper performance of servers and other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit. One common cooling unit is a computer room air conditioning (CRAC) unit that is a device that intakes hot exhaust return air and supplies cooling air to maintain a data center's thermal environment.

Recently, data centers have been deploying more high-power density electronic racks, where more high-density chips are packaged closer together to provide more processing power. Cooling these high-density racks by maintaining a proper thermal environment may be an issue with existing cooling systems, such as a CRAC (computer room air conditioning) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high density deployment. Another challenge for air cooling high density racks is moving a large amount of airflow sufficient to cool the racks.

Immersion cooling, on the other hand, which involves at least partially submerging electronics in a dielectric solution is a feasible solution for high-density electronics. Implementing immersion cooling in existing data centers, however, has challenges. For example, a data center's cooling infrastructure may need to be modified to be able to support operating an immersion cooling system, since existing data centers are designed for either air cooling or other types of liquid cooling. Also, immersion cooling is a more complex cooling solution than existing air/liquid solutions.

Existing solutions for immersion system include deployment of dielectric solution in a single tank. Shortfalls of the single tank solution, as previously mentioned, is the potential loss of dielectric solution, and that deployment of the servers and/or electronic racks is extremely complicated.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspect of the present disclosure are directed to a server, electronic rack immersion design, and/or electronic rack co-design with an immersion system to improve an efficiency of deployment in a data center while significantly reducing the potential loss of dielectric solution associated with single tank solutions.

According to a first aspect, an information technology (IT) equipment cooling system includes a coolant unit to be coupled to an electronic rack, the coolant unit to supply a two phase liquid coolant to two phase coolant manifolds of the electronic rack, and the two phase coolant manifolds to supply the two phase liquid coolant to one or more IT equipment cooling sets to be mounted within the electronic rack. Each of the one or more IT equipment cooling sets includes an IT unit having one or more pieces of IT equipment that is configured to provide IT services and is at least partially submerged within the two phase liquid coolant, where, while the IT equipment provides the IT services, the IT equipment generates heat that is transferred to the two phase liquid coolant thereby causing at least some of the two phase liquid coolant to turn into vapor phase. The IT equipment cooling set includes an IT condensing unit having a condenser that is positioned above the IT unit and the condenser is configured to condense the vapor back into liquid phase.

In one embodiment, the coolant unit comprises a container within the coolant unit which is used to store two phase coolant. In one embodiment, the coolant unit includes a charging pump used for pumping the two phase coolant to the one or more IT equipment cooling sets housed within the electronic rack, and a draining pump used for draining the two phase coolant from the one or more IT equipment cooling sets within the electronic rack. In one embodiment, the coolant unit is manufactured as part of the electronic rack, wherein the coolant unit is situated beneath the electronic rack.

In one embodiment, the electronic rack includes a first inlet port coupled to the charging pump of the coolant unit, and a first outlet port coupled to the draining pump of the coolant unit, where the first inlet port and the first outlet port are to charge or drain the two phase coolant from the electronic rack, respectively. In one embodiment, the electronic rack comprises a second inlet port and a second outlet port, where the second inlet port and the second outlet port are to circulate a single-phase fluid to a condenser of an IT equipment cooling set.

In one embodiment, each IT unit includes a fluid level sensor to sense a fluid level of the two-phase coolant within the IT unit, and a valve between the IT unit and the two phase coolant manifolds of the electronic rack, where the fluid level is used to control the valve and the charging pump of the coolant unit, where if the valve is not open, the two phase coolant would not be charged to the IT unit. In one embodiment, the coolant unit includes a first three-way valve with a first port coupled to the charging pump, a second port coupled the manifold of the electronic rack, and a third port coupled to a central coolant system. The coolant unit includes a second three-way valve with a fourth port coupled to the draining pump, a fifth port coupled the manifold of the electronic rack, and a sixth port coupled to the central coolant system.

In one embodiment, the first three-way valve is operated to have the first and second ports open to pump the two phase coolant from coolant unit to the electronic rack, where the first three-way valve is operated to have the first and third ports open to pump the two phase coolant from the coolant unit to the central coolant system. In one embodiment, the second three-way valve is operated to have the fourth and fifth ports open to pump the two phase coolant from the electronic rack to the coolant unit, where the second three-way valve is operated to have the fourth and sixth ports open to pump the two phase coolant from the central coolant system to the coolant unit.

According to a second aspect, a data center system includes a central coolant system, a number of information technology (IT) equipment cooling systems, and a distribution line to distribute two phase coolant from the central coolant system to the IT equipment cooling systems. Each of the Information Technology (IT) equipment cooling systems includes a coolant unit to be coupled to an electronic rack, the coolant unit to supply a two phase liquid coolant to two phase coolant manifolds of the electronic rack, and the two phase coolant manifolds to supply the two phase liquid coolant to one or more IT equipment cooling sets to be mounted within the electronic rack. Each of the one or more IT equipment cooling sets includes an IT unit having one or more pieces of IT equipment that is configured to provide IT services and is at least partially submerged within the two phase liquid coolant, where, while the IT equipment provides the IT services, the IT equipment generates heat that is transferred to the two phase liquid coolant thereby causing at least some of the two phase liquid coolant to turn into vapor phase. The IT equipment cooling set includes an IT condensing unit having a condenser that is positioned above the IT unit and the condenser is configured to condense the vapor back into liquid phase.

Figure 1:
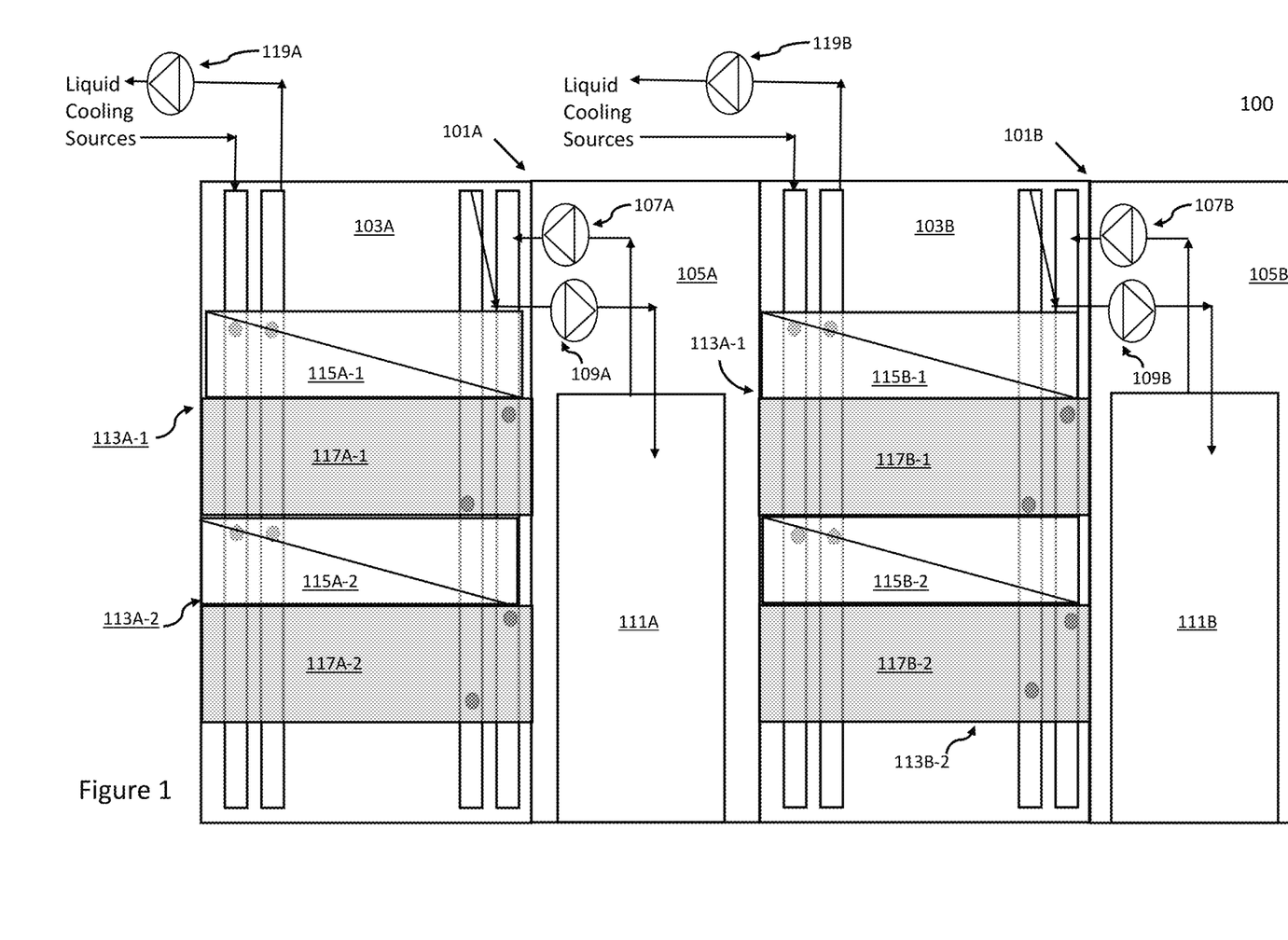
FIG. 1 is a block diagram illustrating an example of two modular information technology (IT) equipment cooling systems according to one embodiment.

FIG. 1 is a block diagram illustrating an example of a modular information technology (IT) equipment cooling system architecture 100 according to one embodiment. The system architecture 100 illustrates two separate modules 101A-101B.

Each of modules 101A-101B includes an electronic rack 103A-103B and a two-phase coolant unit 105A-105B adjacent to the electronic rack 103A-103B. In one embodiment, two-phase coolant unit 105A-105B are beneath electronic rack 103A-103B. Each coolant unit 105A-105B includes a respective container 111A-111B used to store two-phase coolant, where coolant units 105A-105B manage a flow of the two-phase coolant between individual electronic racks 103A-103B and containers 111A-111B. Coolant units 105A-105B include charging pumps 107A-107B and draining pumps 109A-109B. Charging pumps 107A-107B are used for pumping two-phase coolant to the electronic racks 103A-103B and the draining pumps 109A-109B are used for draining two-phase coolant away from the electronic racks 103A-103B.

Each electronic rack 103A-103B can be populated with one or more cooling sets 113. Each of cooling sets 113A-113B can include an IT condensing unit 115A-115B and an IT unit 117A-117B, respectively. IT condensing unit 115A-115B can be populated on top of respective IT unit 117A-117B, where the IT condensing unit 115A-115B can be connecting, via a liquid cooling loop, to a liquid cooling source. In an embodiment, IT condensing units 115 are connected to the liquid cooling source via recirculation pumps 119. In one embodiment, cooling liquid circulating from liquid cooling source is different from two phase liquid coolant. Although only two modules are shown, system architecture 100 can include any number of modules.

Figure 2:
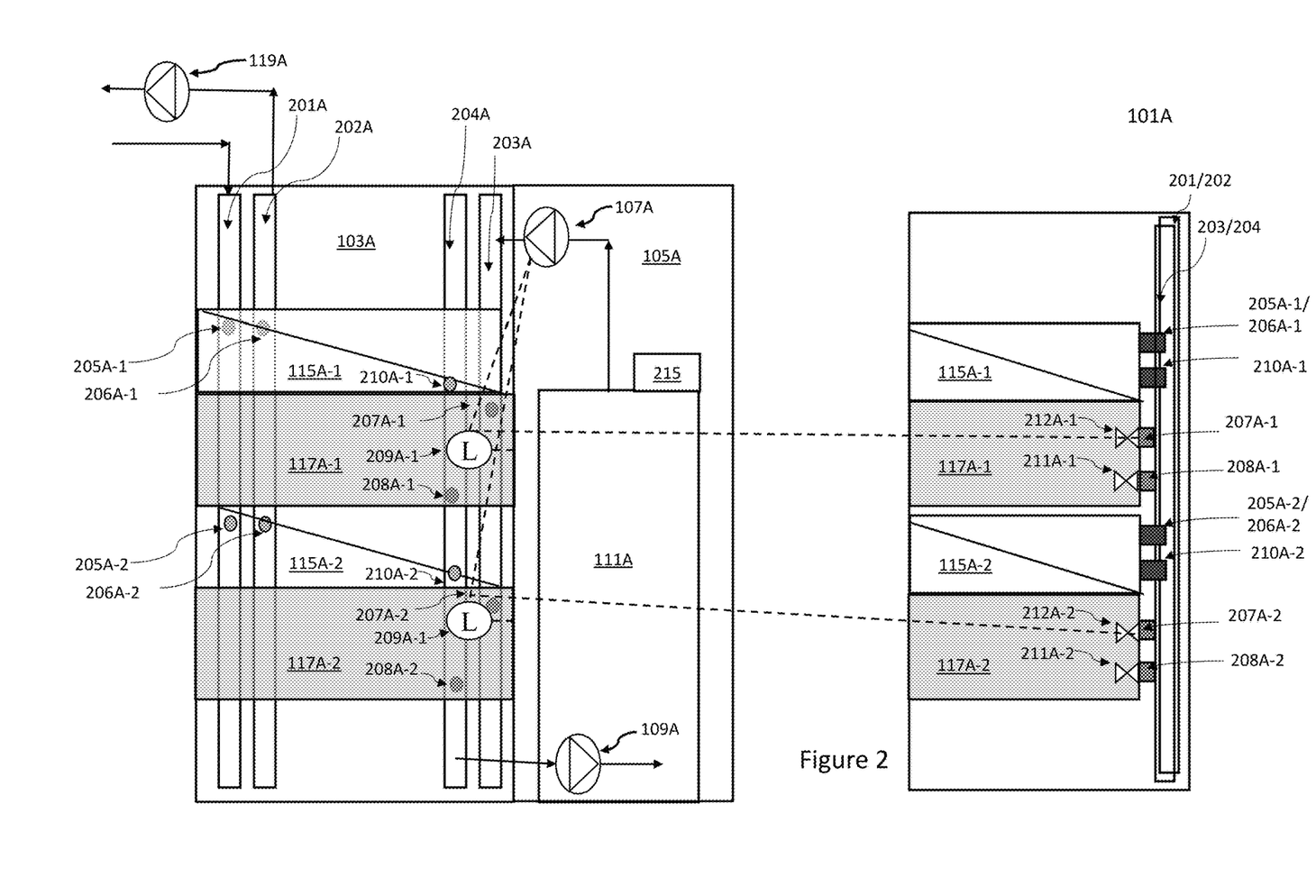
FIG. 2 is a block diagram illustrating a front view and a side view of a modular IT equipment cooling system according to one embodiment.

Ports and connectors can be used to connect a liquid cooling source to the IT condensing units and to connect coolant units to corresponding IT units as further shown in FIG. 2.

FIG. 2 is a block diagram illustrating a front view and a side view of a modular IT equipment cooling system 101A according to one embodiment. FIG. 2 illustrates two separate fluid circulation systems for cooling system 101A. A first liquid circulation system utilizes cooling liquid manifolds 201A and 202A, to supply and return cooling liquid, respectively, for IT condensing units 115A-1, 115A-2. A second liquid system utilizes coolant supply manifold 203A and coolant return manifold 204A, to supply and return two-phase coolant to and from IT units 117A-1, 117A-2, respectively. Two-phase coolant may be a cooling dielectric solution, where IT electronics contained in IT units are at least partially submerged in.

Referring to FIG. 2, in one embodiment, cooling system 101A includes a controller 215 to control the supply/return of two-phase coolant to individual IT units 117A-1, 117A-2 via coolant unit 105A. It can be seen that each individual IT units 117A-1, 117A-2 includes a respective fluid level sensor 209A-1, 209A-2, where each fluid level sensor 209A-1, 209A-2 can be used to activate charging pump 107A and/or a corresponding control valve 212A-1, 212A-2. In one embodiment, control valves 212A-1, 212A-2 are situated within corresponding IT units 117A-1, 117A-2. When IT units 117A-1, 117A-2 are to be filled with two phase coolant in liquid phase, charging pump 107A and corresponding valves 212A-1, 212A-2 can be activated to supply two phase coolant to corresponding IT units. In one embodiment, controller 215 receives signals from fluid level sensors 209A-1, 209A-2 to activate charging pump 107A and corresponding valves 212A-1, 212A-2 according to a preconfigured fluid level.

When charging pump 107A pumps two-phase coolant to individual IT units 117A-1, 117A-2 and if a corresponding valve 212A-1, 212A-2 is not open, coolant would not be filled to corresponding IT units 117A-1, 117A-2. Since charging pump 107A is used for multiple IT units 117A-1, 117A-2, therefore, each individual IT unit 117A-1, 117A-2 requires a separate control valve 212A-1, 212A-2. This means individual IT units 117A-1, 117A-2 can be filled independently.

In one embodiment, IT units 117A-1, 117A-2 includes corresponding control valves 211A-1, 211A-2 to discharge two-phase coolant. In this case, controller 215 can receive a command signal from a facility operator to activate one or more control valves 211A-1, 211A-2, and discharge pump 109A, to deplete one or more IT units 117A-1, 117A-2 of two-phase coolant from the IT units 117A-1, 117A-2 for services and/or maintenance purposes.

In one embodiment, control valves 212A-1, 212A-2 are coupled to one or more supply ports 207A-1, 207A-2 of IT units 117A-1, 117A-2, where coolant supply manifold 203A of electronic rack 103A are connected to the one or more supply ports 207A-1, 207A-2.

In one embodiment, control valves 211A-1, 211A-2 are coupled to one or more return ports 208A-1, 208A-2 of IT units 117A-1, 117A-2, where coolant return manifold 204A of electronic rack 103A are connected to the one or more return ports 208A-1, 208A-2.

In this case, charging pump 107A can pump two-phase coolant to IT units 117A-1, 117A-2 via connectors connected to ports 207A-1, 207A-2, where two-phase coolant pumped to IT units 117A-1, 117A-2 can be used to at least partially submerge IT electronics within IT units 117A-1, 117A-2. The two-phase coolant, when in contact with heat generated by IT electronics, is caused to evaporate from a liquid state to a vapor state thereby absorbing the heat from the IT electronics. The two-phase coolant, in the vapor state carries the heat and rises to a respective IT condensing unit 115A-1, 115A-2, where the two-phase coolant in their vapor state is condensed by condensing coils (not shown) back to liquid state. Coolant return manifold 204A receives the condensed coolant via ports 210A-1, 210A-2, where the condensed liquid phase coolant can be discharged to coolant unit 105A.

For the cooling liquid circulation system, liquid supply manifold 201A are connected to one or more supply ports 205A-1, 205A-2 of IT condensing units 115A-1, 115A-2. Liquid return manifold 202A are connected to one or more return ports 206A-1, 206A-2 of IT condensing units 115A-1, 115A-2. Cooling liquid can be supplied to ports 205A-1, 205A-2, via recirculation pump 119A, where cooling liquid is to be circulated through condensing coils within IT condensing units 115A-1, 115A-2. From the IT condensing units 115A-1, 115A-2, cooling liquid carries heat extracted from the condensing coils and exits IT condensing units 115A-1, 115A-2 via return ports 206A-1, 206A-2.

Figure 3:
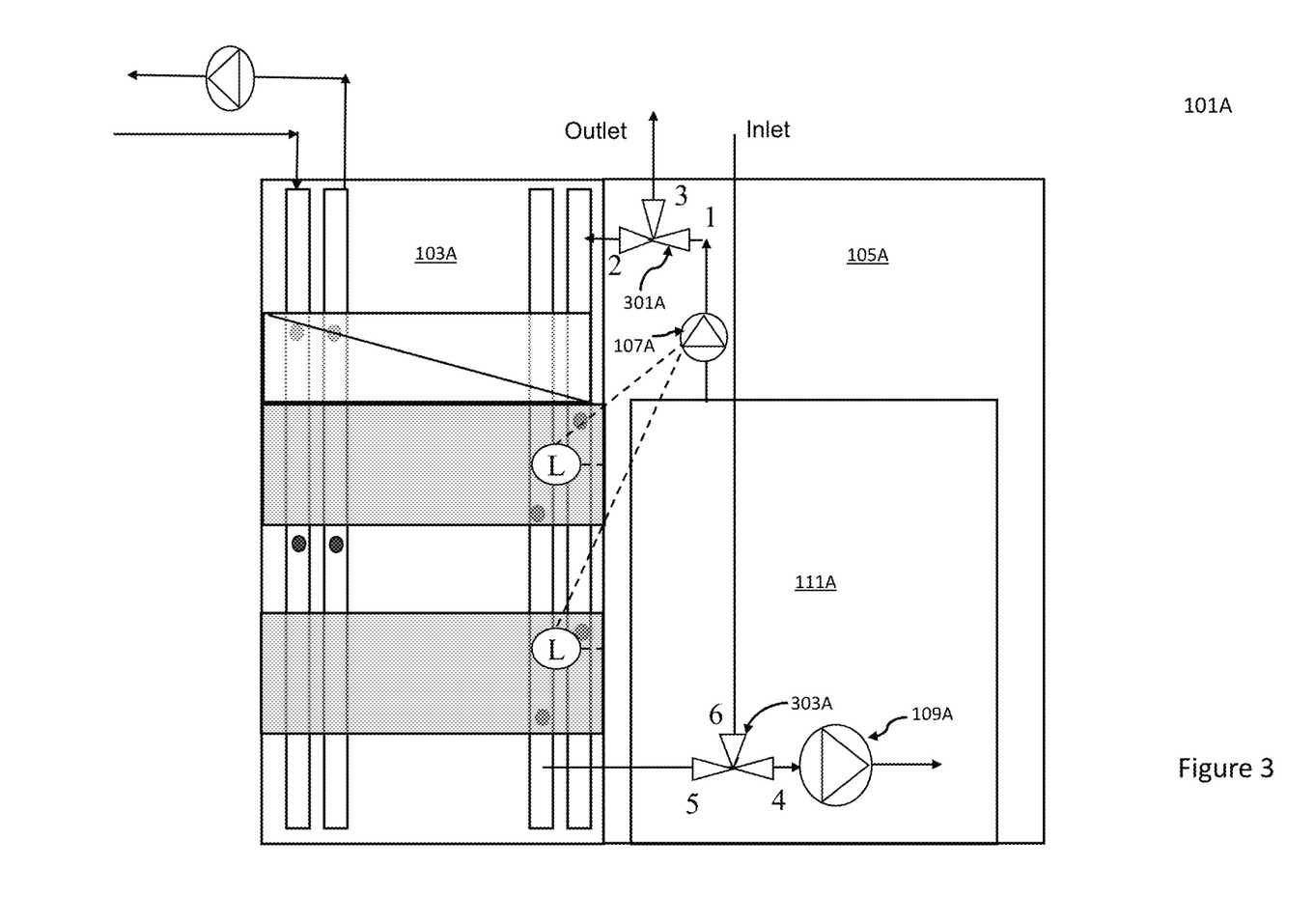
FIG. 3 is a block diagram illustrating fluid management of a coolant unit of a modular IT equipment cooling system according to one embodiment.

FIG. 3 is a block diagram illustrating fluid management of a coolant unit 105A according to one embodiment. In one embodiment, coolant unit 105A includes three way valves 301A, 303A at the fluid lines of respective pumps 107A and 109A. The three way valves 301A, 303A can be used to control a functionality of pumps 107A and 109A.

For example, charging pump 107A can be used to either pump coolant from coolant unit 105A to electronic rack 103A, or to pump coolant from coolant unit 105A to a central coolant system (outlet) at the data center facility. Draining pump 109A can be used to either pump coolant from electronic rack 103A to coolant unit 105A or to pump coolant from the central coolant system (inlet) to coolant unit 105A. The following shows the states for the respective valves.

In one embodiment, for valve 301A, if ports 1-2 are open, then charging pump 107A is operated to pump coolant from coolant unit 105A to electronic rack 103A. If ports 1-3 of valve 301A are open, then charging pump 107A is operated to pump coolant from coolant unit 105A to the central coolant system (outlet).

In one embodiment, for valve 303A, if ports 4-5 are open, then draining pump 109A is operated to pump coolant from one or more IT units on the electronic rack 103A to coolant unit 105A. If ports 4-6 for valve 303A are open, then draining pump 109A is operated to pump coolant from the central coolant system (inlet) to coolant unit 105A. Although three way valves are illustrated in this embodiment, different combinations of two way valves can also be used instead of the three way valves.

Figure 4:
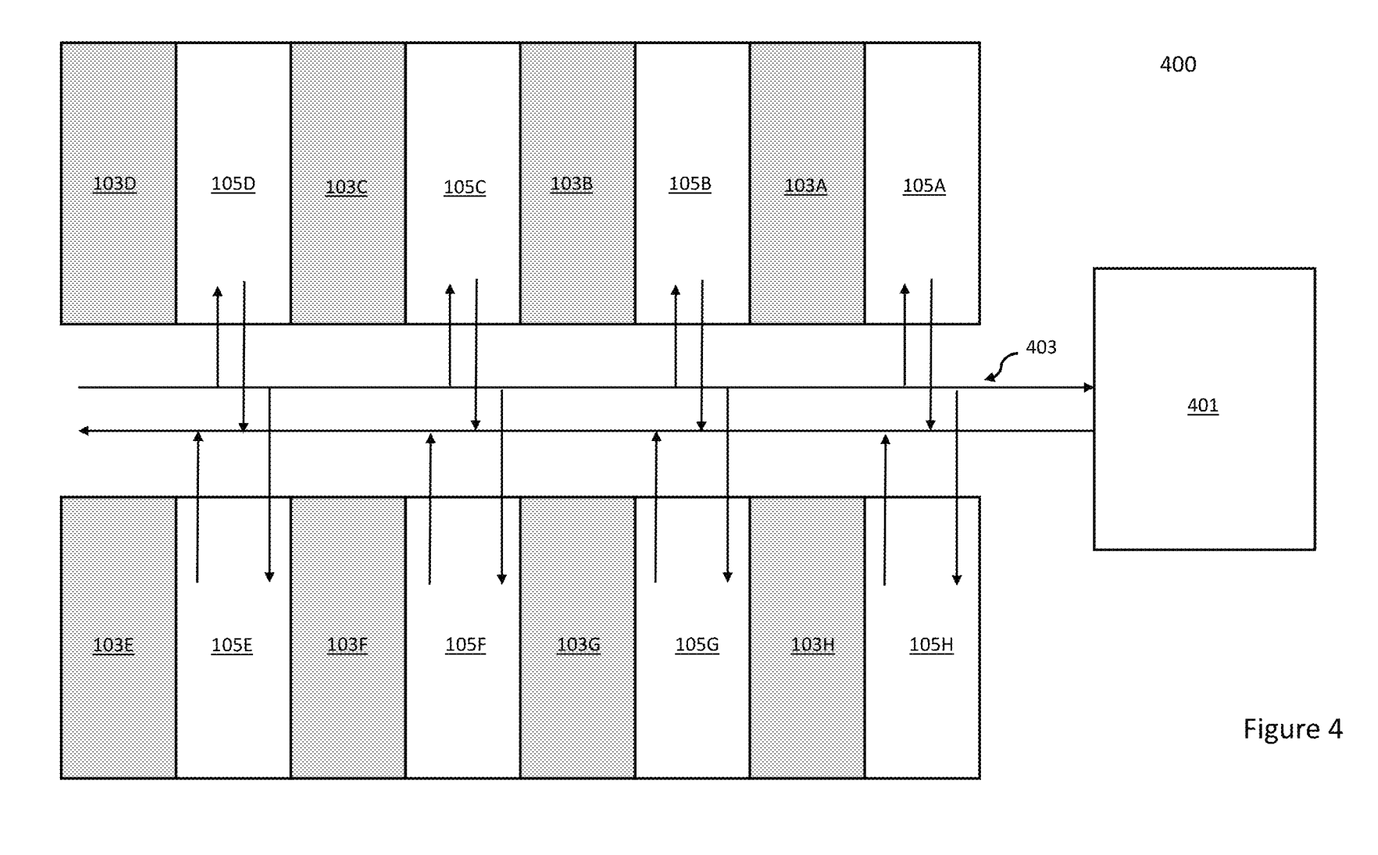
FIG. 4 is a plan view of a block diagram illustrating a cluster of modular IT equipment cooling systems with a central coolant system according to one embodiment.

FIG. 4 is a plan view of a block diagram illustrating a data center 400 with a cluster of modular IT equipment cooling systems according to one embodiment. As shown in FIG. 4, data center 400 includes 8 modules, each module includes an electronic rack 103A-103H with a coolant unit 105A-105H adjacent to the respective electronic rack 103A-103H. The coolant units 105A-105H are connected to a central coolant system 401 through a distribution loop 403. Central coolant system 401 can be coupled to distribution loop 403 through inlet/outlet ports (not shown) at the central coolant system 401. In this case, central coolant system 401 can store two phase coolant to be distributed to coolant units 105A-105H, or coolant units 105A-105H can discharge coolant back to central coolant system 401 for storage.

Although it is shown the electronic racks 103A-103H are arranged adjacent to a corresponding coolant unit 105A-105H, other arrangements can be used for deployment, such as a staggered arrangement.

Figure 5:
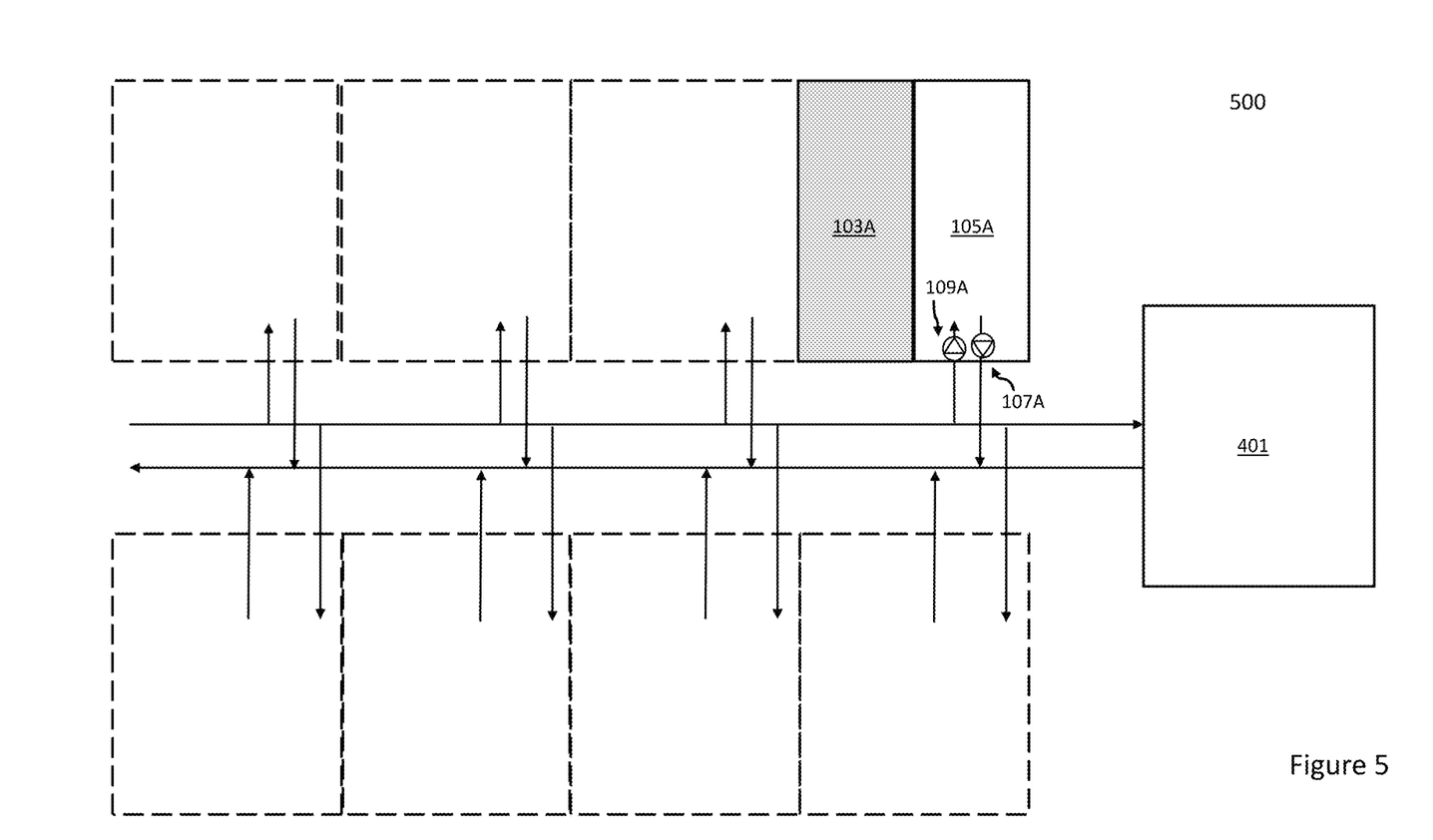
FIG. 5 is a block diagram illustrating a first deployment scenario according to one embodiment.

FIG. 5 is a block diagram illustrating a first deployment scenario 500 according to one embodiment. As shown, electronic rack 103A and coolant unit 105A can be combined as a single set for deployment. E.g., electronic rack 103A and coolant unit 105A are deployed together. The pumps 107A, 109A are the corresponding charging pump 107A and draining pump 109A of the coolant unit 105A.

Figure 6:
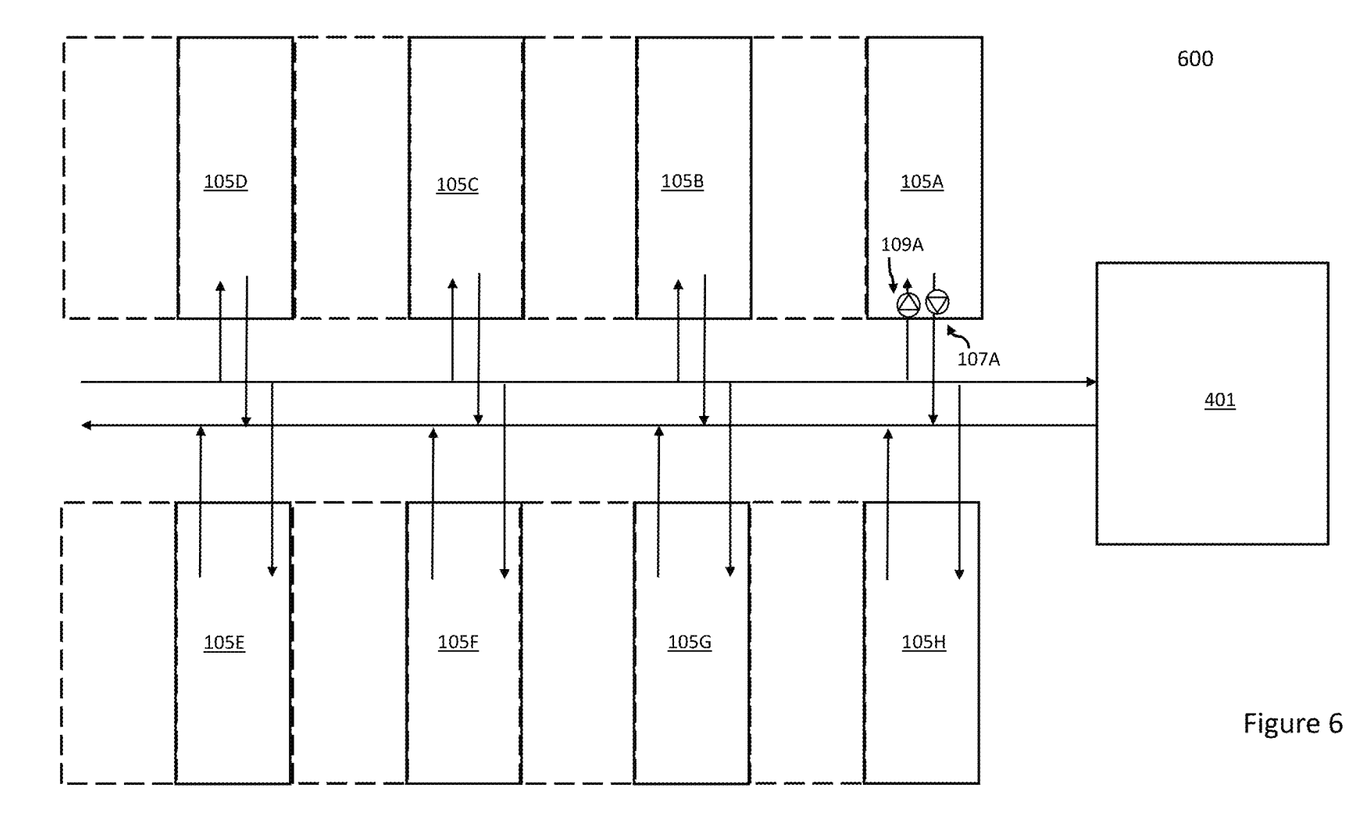
FIG. 6 is a block diagram illustrating a second deployment scenario according to one embodiment.

FIG. 6 is a block diagram illustrating a second deployment scenario 600 according to one embodiment. FIG. 6 illustrates another deign where coolant units 105A-105H and respective electronic racks are separately deployed and commissioned. The coolant units 105A-105H are deployed and commissioned first, at the data center facility by connecting coolant units 105A-105H to central coolant system 401 and charging coolant units 105A-105H with two-phase coolant. Electronic racks can be separately deployed and commissioned thereafter.

In both deployment scenarios 500, 600, two phase coolant are filled in the central coolant units 105A-105H. Each individual coolant unit 105A-105H may pump the coolant from the central coolant system 401 to their internal containers. Then, coolant units 105A-105H can pump the coolant from their internal containers to IT units of electronic racks to immerge IT electronics in the coolant. In a service mode, the coolant can be discharged from the IT units to the coolant units 105A-105H, and from coolant units 105A-

105H to central coolant system 401, by operating the charging/discharging pumps and one or more control valves at the coolant unit.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An Information Technology (IT) equipment cooling system, comprising:
   a coolant unit to be coupled to an electronic rack, the coolant unit to supply a two phase liquid coolant to two phase coolant manifolds of the electronic rack, and the two phase coolant manifolds to supply the two phase liquid coolant to one or more information technology (IT) equipment cooling sets to be mounted within the electronic rack, wherein each of the one or more IT equipment cooling sets comprises:
      an IT unit having one or more pieces of IT equipment that is configured to provide IT services and is at least partially submerged within the two phase liquid coolant, wherein, while the IT equipment provides the IT services, the IT equipment generates heat that is transferred to the two phase liquid coolant thereby causing at least some of the two phase liquid coolant to turn into vapor phase; and
      an IT condensing unit having a condenser that is positioned above the IT unit and the condenser is configured to condense the vapor back into liquid phase.

2. The IT equipment cooling system of claim 1, wherein the coolant unit comprises a container within the coolant unit which is used to store two phase liquid coolant.

3. The IT equipment cooling system of claim 1, wherein the coolant unit comprises:
   a charging pump used for pumping the two phase coolant to the one or more IT equipment cooling sets housed within the electronic rack; and
   a draining pump used for draining the two phase coolant from the one or more IT equipment cooling sets within the electronic rack.

4. The IT equipment cooling system of claim 3, wherein the electronic rack comprises:
   a first inlet port coupled to the charging pump of the coolant unit; and
   a first outlet port coupled to the draining pump of the coolant unit, wherein the first inlet port and the first outlet port are to charge or drain the two phase coolant from the electronic rack, respectively.

5. The IT equipment cooling system of claim 1, wherein the electronic rack comprises a second inlet port and a second outlet port, wherein the second inlet port and the second outlet port are to circulate a single-phase fluid to a condenser of an IT equipment cooling set.

6. The IT equipment cooling system of claim 4, wherein each IT unit comprises:
   a fluid level sensor to sense a fluid level of the two-phase coolant within the IT unit; and
   a valve between the IT unit and the two phase coolant manifolds of the electronic rack, wherein the fluid level is used to control the valve and the charging pump of the coolant unit, wherein if the valve is not open, the two phase coolant would not be charged to the IT unit.

7. The IT equipment cooling system of claim 4, wherein the coolant unit comprises:
   a first three-way valve with a first port coupled to the charging pump, a second port coupled the manifold of the electronic rack, and a third port coupled to a central coolant system; and
   a second three-way valve with a fourth port coupled to the draining pump, a fifth port coupled the manifold of the electronic rack, and a sixth port coupled to the central coolant system.

8. The IT equipment cooling system of claim 7, wherein the first three-way valve is operated to have the first and second ports open to pump the two phase coolant from coolant unit to the electronic rack, wherein the first three-way valve is operated to have the first and third ports open to pump the two phase coolant from the coolant unit to the central coolant system.

9. The IT equipment cooling system of claim 7, wherein the second three-way valve is operated to have the fourth and fifth ports open to pump the two phase coolant from the electronic rack to the coolant unit, wherein the second three-way valve is operated to have the fourth and sixth ports open to pump the two phase coolant from the central coolant system to the coolant unit.

10. The IT equipment cooling system of claim 1, wherein the coolant unit is deployed as a single set with the electronic rack.

11. A data center system, comprising:
    a central coolant system;
    a plurality of information technology (IT) equipment cooling systems; and
    a distribution line to distribute two phase coolant from the central coolant system to the plurality of IT equipment cooling systems, wherein each of the plurality of Information Technology (IT) equipment cooling systems comprises:
       a coolant unit to be coupled to an electronic rack, the coolant unit to supply a two phase liquid coolant to two phase coolant manifolds of the electronic rack, and the two phase coolant manifolds to supply the two phase liquid coolant to one or more Information Technology (IT) equipment cooling sets to be mounted within the electronic rack, wherein each of the one or more IT equipment cooling sets comprises:
          an IT unit having one or more pieces of IT equipment that is configured to provide IT services and is at least partially submerged within the two phase liquid coolant, wherein, while the IT equipment provides the IT services, the IT equipment generates heat that is transferred to the two phase liquid coolant thereby causing at least some of the two phase liquid coolant to turn into vapor phase; and
          an IT condensing unit having a condenser that is positioned above the IT unit and the condenser is configured to condense the vapor back into liquid phase.

12. The data center system of claim 11, wherein the coolant unit of an IT equipment cooling set is attachable or detachable from the electronic rack of the IT equipment cooling set.

13. The data center system of claim 12, wherein the coolant unit comprises a container within the coolant unit which is used to store two phase coolant.

14. The data center system of claim 12, wherein the coolant unit comprises:

a charging pump used for pumping the two phase coolant to the one or more IT equipment cooling sets housed within the electronic rack; and a draining pump used for draining the two phase coolant from the one or more IT equipment cooling sets within the electronic rack.

15. The data center system of claim 14, wherein the electronic rack comprises:
   a first inlet port coupled to the charging pump of the coolant unit; and
   a first outlet port coupled to the draining pump of the coolant unit, wherein the first inlet port and the first outlet port are to charge or drain the two phase coolant from the electronic rack, respectively.

16. The data center system of claim 12, wherein the electronic rack comprises a second inlet port and a second outlet port, wherein the second inlet port and the second outlet port are to circulate a single-phase fluid to a condenser of an IT equipment cooling set.

17. The data center system of claim 15, wherein each IT unit comprises:
   a fluid level sensor to sense a fluid level of the two-phase coolant within the IT unit; and
   a valve between the IT unit and the two phase coolant manifolds of the electronic rack, wherein the fluid level is used to control the valve and the charging pump of the coolant unit, wherein if the valve is not open, the two phase coolant would not be charged to the IT unit.

18. The data center system of claim 15, wherein the coolant unit comprises:
   a first three-way valve with a first port coupled to the charging pump, a second port coupled the manifold of the electronic rack, and a third port coupled to a central coolant system; and
   a second three-way valve with a fourth port coupled to the draining pump, a fifth port coupled the manifold of the electronic rack, and a sixth port coupled to the central coolant system.

19. The data center system of claim 18, wherein the first three-way valve is operated to have the first and second ports open to pump the two phase coolant from coolant unit to the electronic rack, wherein the first three-way valve is operated to have the first and third ports open to pump the two phase coolant from the coolant unit to the central coolant system.

20. The data center system of claim 18, wherein the second three-way valve is operated to have the fourth and fifth ports open to pump the two phase coolant from the electronic rack to the coolant unit, wherein the second three-way valve is operated to have the fourth and sixth ports open to pump the two phase coolant from the central coolant system to the coolant unit.

* * * * *